United States Patent [19]
Guo et al.

[11] Patent Number: 5,257,239
[45] Date of Patent: Oct. 26, 1993

[54] MEMORY CELL WITH KNOWN STATE ON POWER-UP

[75] Inventors: Ta-Pen Guo, Cupertino; Adi Srinivasan, Fremont, both of Calif.

[73] Assignee: Aptix Corporation, San Jose, Calif.

[21] Appl. No.: 913,692

[22] Filed: Jul. 14, 1992

[51] Int. Cl.[5] .............................. G11C 11/40
[52] U.S. Cl. ................ 365/230.06; 365/189.05; 365/189.06; 365/189.09; 365/226
[58] Field of Search .............. 365/230.06, 226, 189.09, 365/189.06, 189.05

[56] References Cited

U.S. PATENT DOCUMENTS

| | | | |
|---|---|---|---|
| 4,567,578 | 1/1986 | Cohen et al. | 365/189.04 |
| 4,821,233 | 4/1989 | Hsieh | 365/203 |
| 4,858,182 | 8/1989 | Paug et al. | 365/226 X |
| 5,189,640 | 2/1993 | Huard | 365/230.06 X |

*Primary Examiner*—Eugene R. LaRoche
*Assistant Examiner*—Do Hyun Yoo
*Attorney, Agent, or Firm*—Kenneth D'Alessandro

[57] ABSTRACT

Apparatus for forcing a memory cell to a known state upon power-up includes circuitry for providing two signals PWRUP and PWRUPB which are used during chip power-up. At power-up, as $V_{CC}$ rises from 0 volt to 3.5 volts, the PWRUP signal follows $V_{CC}$ and the PWRUPB signal maintains 0 volts. The PWRUP and PWRUPB signals are used to drive the gates of P-Channel and N-Channel MOS transistors, respectively, including pass gates connected between word line driver circuits and bit line driver circuits driving the word lines and bit lines associated with the memory cells. In addition, the PWRUPB signal is used to drive P-Channel MOS pullup transistors connected between the word lines and $V_{CC}$ and the bit lines and $V_{CC}$. During power-up, the pass gates are disabled, disconnecting the word lines and bit lines from their drivers. The word lines and bit lines are forced to follow the rise of $V_{CC}$ by the P-Channel pullup transistors. When $V_{CC}$ reaches its desired value, the PWRUP signal goes to 0 volts and the PWRUPB signal goes to $V_{CC}$, thus turning on the pass gates to connect the word line and bit line driver circuits to the word lines and bit lines. The $V_{CC}$ final PWRUPB signal turns off the P-Channel MOS pullup transistors connected between the word lines and $V_{CC}$ and the bit lines and $V_{CC}$.

4 Claims, 3 Drawing Sheets

MEMORY CELL WITH KNOWN STATE ON POWER-UP

BACKGROUND OF THE INVENTION

1. Field of the Invention

The present invention relates to semiconductor memories and to static memory cells. More particularly, the present invention relates to a static random access memory (SRAM) cell which assumes a known state on power-up.

2. The Prior Art

Static memory devices such as SRAM cells are known to exhibit random initial states on power-up of the integrated circuit which contains them. There can be a problem in some logic arrays if a random initial memory state on power-up causes devices controlled by the memory cell in the array (e.g. programmable connection or switching elements such as a MOS transistor pass gate or switch) to become shorted together. Such short circuits may cause the devices controlled by the memory cells to become un-programmable or even damaged. This is a noticeable problem for large arrays. It is therefore desirable to control the initial memory state of the memory cells on power-up.

There have been prior art attempts to solve this problem and to provide a memory cell which assumes a known initial state on power-up. For example, in U.S. Pat. No. 4,821,233, two P-Channel MOS transistors in each memory cell are differently doped to exhibit different threshold voltages. At power-up, as the power supply voltage level rises from 0 volts to the supply voltage level, the one of the two P-channel MOS transistors requiring the lowest voltage differences between the gate and source will turn on first. This P-channel MOS transistor will in turn apply this increasing level to the gate of the other P-channel MOS transistor, thus preventing the other P-channel MOS transistor from turning on during power-up.

While this solution allows controlling the states of the memory cells during power-up, it requires separate masks for the doping of the two P-channel MOS transistors, thereby prohibiting the use of standard CMOS processes to manufacture integrated circuits containing such devices. This scheme has an additional complication which results from mismatching the P-Channel MOS transistors, making one of them harder to turn "off" during normal operation. This is undesirable.

The prior art has suggested changing the channel length of one of the P-Channel MOS transistors to control its threshold voltage and thus avoids the requirement of using non-standard process steps. But the differences in threshold voltages obtained by this method are acknowledged to be small and less reliable than differential doping. The threshold voltage differential can also be non-uniform because of process variations.

Whichever of these solutions is applied, the prior art power-up state cannot be changed since it is mask-dependent or dependent on the altered device physical parameter like channel length.

It is therefore an object of the invention to provide a memory cell which assumes a known state upon power up which avoids the shortcomings of the prior art.

It is a further object of the present invention to provide a memory cell which assumes a known state upon power up wherein the state on power up may be selected by a user.

Yet another object of the invention is to provide a memory cell which assumes a known state upon power up which may be fabricated using standard CMOS processes.

BRIEF DESCRIPTION OF THE INVENTION

According to the present invention, a memory cell is provided which may be forced to a known state upon power up of the circuit containing the memory cell. The integrated circuit chip containing one or more memory cells is provided with circuitry for providing two signals PWRUP and PWRUPB which are used during chip power-up. Alternatively, the signals PWRUP and PWRUPB may be furnished to the chip through I/O pins and may be generated by the system containing the chip upon power-up of the system. At power-up, as $V_{CC}$ rises from 0 volts to 3.5 volts, the PWRUP signal follows $V_{CC}$ and the PWRUPB signal maintains 0 volts.

The PWRUP and PWRUPB signals are used to drive the gates of P-Channel and N-Channel MOS transistors, respectively, comprising pass gates connected between word line driver circuits and bit line driver circuits driving the word lines and bit lines associated with the memory cells. In addition, the PWRUPB signal is used to drive P-Channel MOS pullup transistors connected between the word lines and $V_{CC}$ and the bit lines and $V_{CC}$.

During power-up, the pass gates are disabled, disconnecting the word lines and bit lines from their drivers. The word lines and bit lines are forced to follow the rise of $V_{CC}$ by the P-Channel pullup transistors. When $V_{CC}$ reaches its desired value, the PWRUP signal goes to 0 volts and the PWRUPB signal goes to $V_{CC}$, thus turning on the pass gates to connect the word line and bit line driver circuits to the word lines and bit lines. The $V_{CC}$ final PWRUPB signal turns off the P-Channel MOS pullup transistors connected between the word lines and $V_{CC}$ and the bit lines and $V_{CC}$.

According to a second aspect of the present invention, the known power-up state may be determined by a user-defined external signal value.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
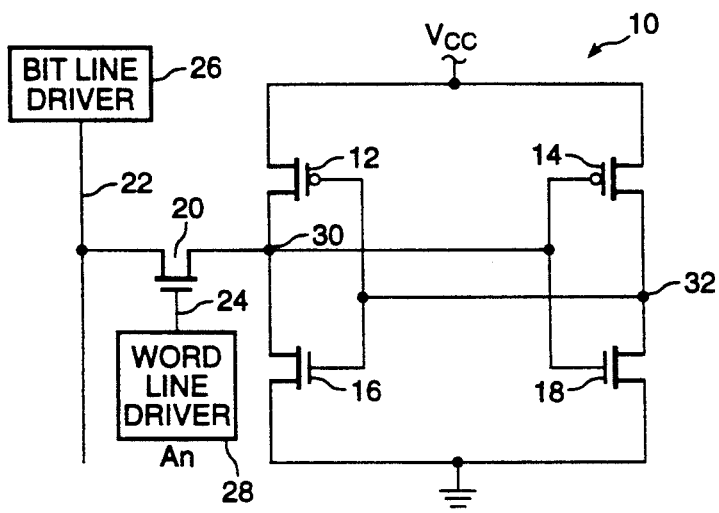
FIG. 1 is a schematic diagram of a typical prior art random access memory cell.

FIG. 1 is a schematic diagram of a typical prior art five-transistor CMOS random access memory cell 10.

P-Channel MOS transistors 12 and 14 and N-Channel MOS transistors 16 and 18 constitute a cross-coupled latch. N-Channel MOS transistor 20 is a gating device (pass transistor) that connects the bit line (data line) 22 to the latch when the voltage on the row select line 24 (address line "$A_n$") is high (i.e., at 5 volts). The bit line 22 is driven by a bit line driver circuit 26. The address line is driven by word line driver 28.

The output signal is taken at the node 30 comprising the common drain connections of P-Channel MOS transistor 12 and N-Channel MOS transistor 16. The output is a logical 1 when N-Channel MOS transistor 16 is off and P-Channel MOS transistor 12 is on, and it is a logical zero when these states are reversed.

Reading from and writing to the memory cell of FIG. 1 are accomplished through the bit lines. For example to read the data out of the memory cell in FIG. 1, a high signal is applied to the row select line 24, turning on N-Channel MOS transistor 20. If a logical 0 is on the output node 30, and a logic 1 is on node 32, the bit line is charged to a lower level. To write a bit into the memory cell, the row select line 24 is brought high and the bit line 22 is charged by the write driver (not shown), which drives node 30 to the same logical level as the bit line. The five-transistor memory cell of FIG. 1 requires one gating device 20 and one bit line 22 to be reliably read and written.

Figure 2:
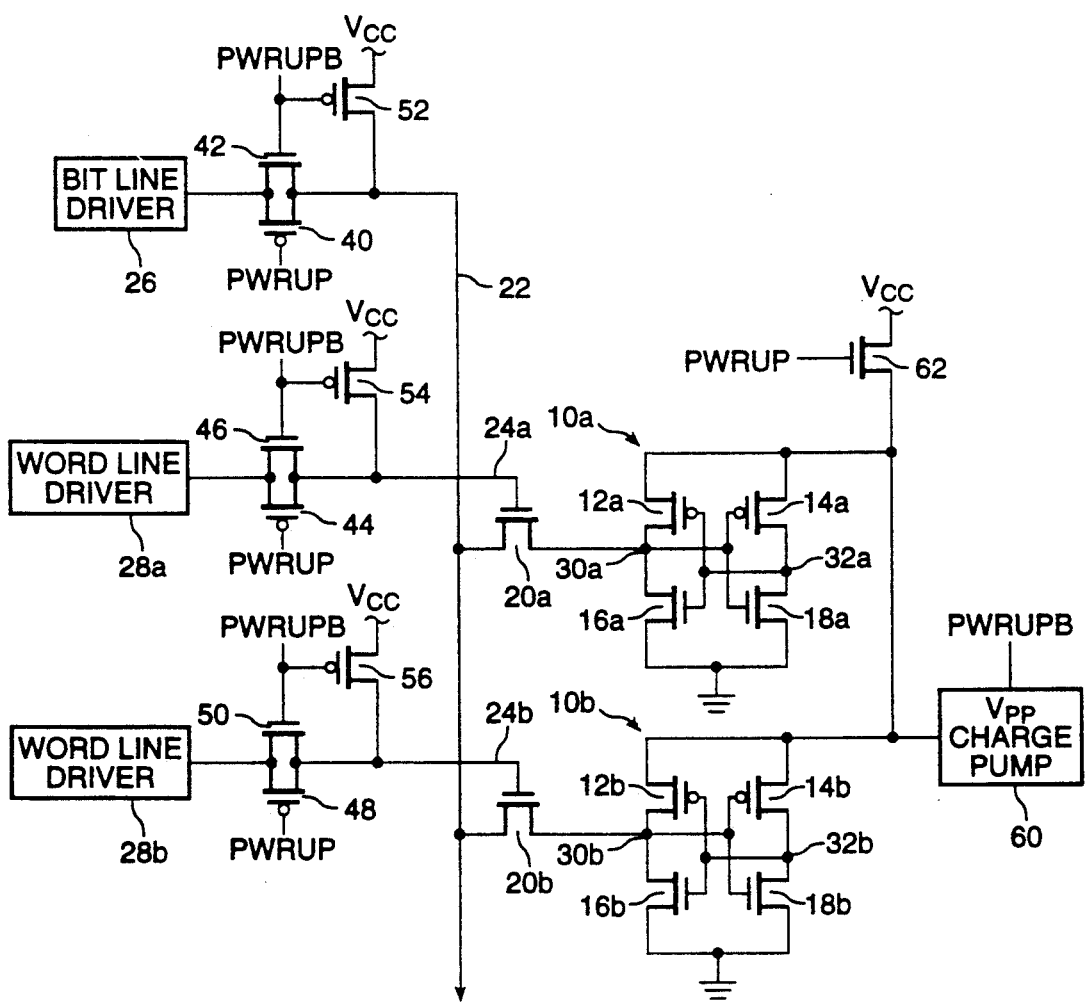
FIG. 2 is a schematic diagram of the memory cell of FIG. 1 and accompanying circuitry according to the present invention for forcing the memory cell to a known state on power-up.

According to the present invention, apparatus and a method are provided to assure a known state of memory cell 10 on power-up. Referring now to FIG. 2, illustrative apparatus according to the present invention for assuring a known state on power-up for a RAM memory cell is shown in schematic diagram form. Two illustrative RAM memory cells 10a and 10b are shown. Memory cell 10a includes P-Channel MOS transistors 12a and 14a and N-Channel MOS transistors 16a and 18a to constitute a cross-coupled latch. N-Channel MOS transistor 20a is a gating device to connects the cross-coupled latch to bit line 22 to the latch when the voltage on the row select line 24a is high. Memory cell 10b includes P-Channel MOS transistors 12b and 14b and N-Channel MOS transistors 16b and 18b to constitute a cross-coupled latch. N-Channel MOS transistor 20b is a gating device to connects the cross-coupled latch to bit line 22 to the latch when the voltage on the row select line 24b is high.

Those of ordinary skill in the art will recognize that the RAM cells of the present invention may be of the type which are driven from a voltage higher than $V_{CC}$ during normal operation. An example of such an application is a circuit in which the RAM cells are used to control pass gates for interconnection. If the pass gates are driven by high gate voltages above $V_{CC}$, there will be no threshold voltage drops across them and hence there will be smaller signal degeneration through the pass gates.

Bit line driver circuit 26 is connected to bit line 22 through a CMOS pass gate comprising P-Channel MOS transistor 40 and N-Channel MOS transistor 42. Word line driver circuit 28a is connected to word line 24a through a CMOS pass gate comprising P-Channel MOS transistor 44 and N-Channel MOS transistor 46. Word line driver circuit 28b is connected to word line 24b through a CMOS pass gate comprising P-Channel MOS transistor 48 and N-Channel MOS transistor 50. Bit line 22 is pulled up to $V_{CC}$ through P-Channel pullup transistor 52. Word line 24a is pulled up to $V_{CC}$ through P-Channel pullup transistor 54 and word line 24b is pulled up to $V_{CC}$ through P-Channel pullup transistor 56.

The gates of P-Channel pass gate transistors 40, 44, and 48 are driven from a signal PWRUP. The gates of N-Channel pass gate transistors 42, 46, and 50, and the gates of P-Channel pullup transistors 52, 54, and 56 are driven from a signal PWRUPB. The signals PWRUP and PWRUPB may be generated either on chip or externally.

Figure 3:
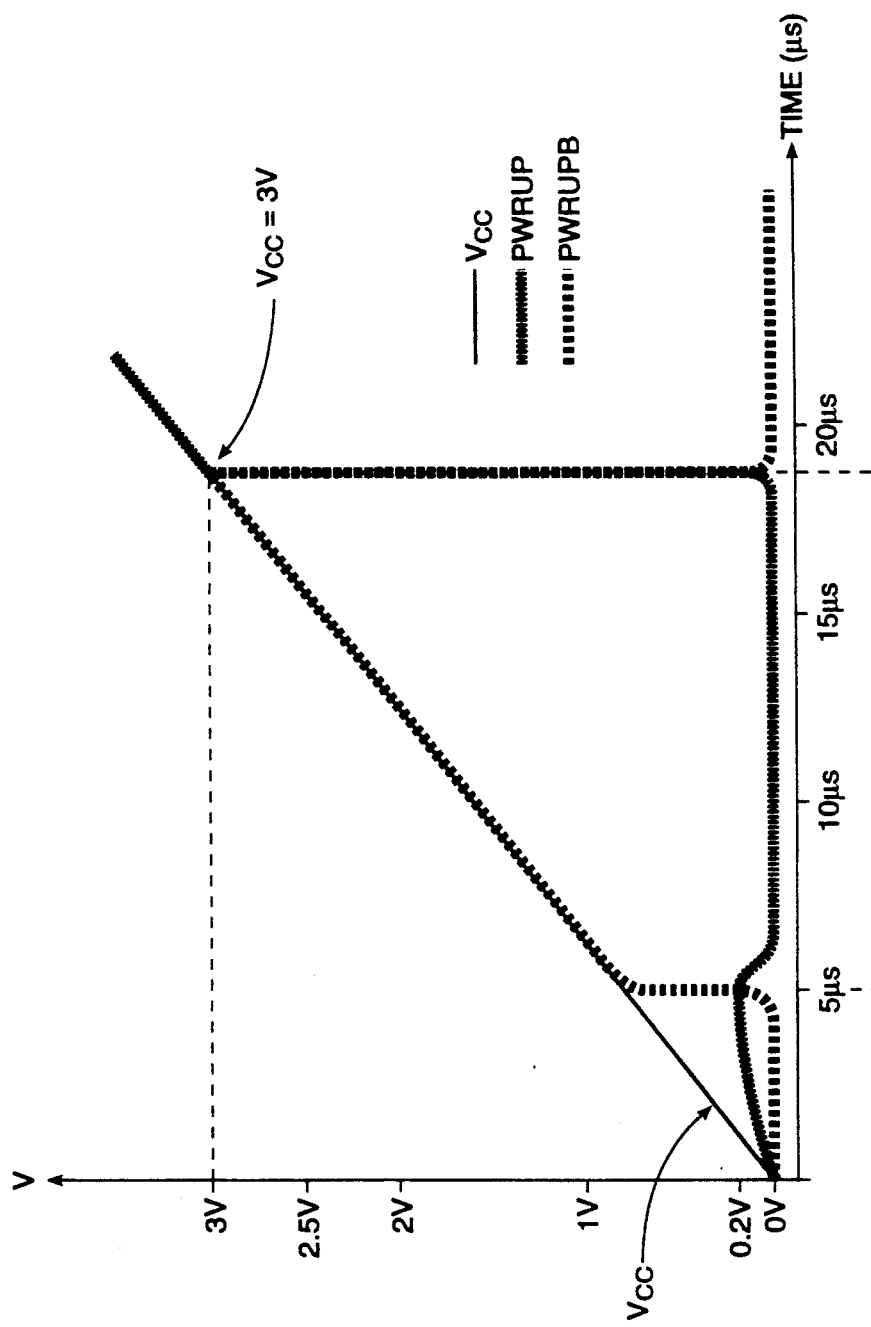
FIG. 3 is a graph of voltage versus time, showing illustrative waveforms for the PWRUP and PWRUPB signals used in the circuitry of FIG. 2.

Referring now to FIG. 3, a graph of voltage versus time, shows illustrative waveforms for the PWRUP and PWRUPB signals used in the circuitry of FIG. 2. As can be seen from FIG. 3, at power-up, as $V_{CC}$ rises from 0 volts to 3.5 volts the PWRUPB signal maintains 0 volts and the PWRUP signal follows $V_{CC}$. Therefore the pass gate transistors 40 and 42 associated with the bit line driver and pass gate transistors 44, 46, 48, and 50 associated with the word line drivers are initially off at power-up. The P-Channel pullup transistor 52 is initially on during power up since its gate is tied to PWRUPB, and it will charge the bit line 22 to follow $V_{CC}$. Word lines 24a and 24b will likewise follow $V_{CC}$ during power-up as they will be pulled up by transistors 54 and 56.

Since the bit line 22 and word lines 24a and 24b are high during power-up, N-Channel transistors 20a and 20b will be turned on. Thus nodes 30a and 30b of the RAM cells will be driven to a logic 1 and nodes 32a and 32b will be driven to a logic 0. RAM cells 10a and 10b are set to a known state by controlling the bit line polarity during power-up. Those of ordinary skill in the art will recognize that, instead of driving bit line 22 high by pulling it up through transistor 52, bit line 22 could be pulled down to ground through an N-Channel MOS transistor gated by PWRUP, thus initially setting RAM cells 10a and 10b to the opposite state on power-up.

In an application as previously described wherein the RAM cells are used to drive pass gates such as in a user-programmable interconnect architecture, a single bit line driver 26 may need to write hundreds of RAM cells during power-up. In the worst case scenario where many cells are being initialized, the $V_{PP}$ charge pump 60 normally used to power the RAM cells is disabled during power-up. The PWRUPB (or PWRUP) signal is used to disable the oscillator of the charge pump 60 during power-up and N-Channel MOS transistor 62 charges the high power rail of the memory cells 10a and 10b to a voltage equal to $V_{CC}-V_{tn}$. At this lower voltage, bit line 22 can drive larger numbers of memory cells. Those of ordinary skill in the art will recognize that, depending on the particular design of charge pump 60, numerous ways are available to disable it using either the PWRUP or PWRUPB signal.

N-Channel MOS transistor 62 is the only device to be on during power-up to charge $V_{PP}$ to the voltage level $V_{CC}-V_{tn}$. Since the bit line voltage follows $V_{CC}$ which is at least one $V_{tn}$ higher than node 30a and 30b, the RAM cell's cross coupled latch is more easily overwritten by the bit line driver.

As can be seen from FIG. 3, after power-up the PWRUP signal is low and the PWRUPB signal is high. In this state, the pass gate transistors 40 and 42 associated with the bit line driver and pass gate transistors 44, 46, 48, and 50 associated with the word line drivers are in their on state. The P-Channel pullup transistor 52 is off since its gate is tied to PWRUPB, and it will charge the bit line 22 to follow $V_{CC}$. Word lines 24a and 24b are freed from $V_{CC}$ since P-Channel MOS pullup transistors 54 and 56 are also turned off.

A major advantage of this scheme is that the process need not be altered to add an artificial mismatch between the P-Channel MOS transistors in the memory cells to favor the selected state on power-up. The capability to write the bit line suffices. Other tricks, such as device sizing or any other process-dependent schemes to change the threshold voltage of one of the P-Channel MOS transistors are not used. This approach can be implemented by use of the original (conventional) process without modifications.

Figure 4:
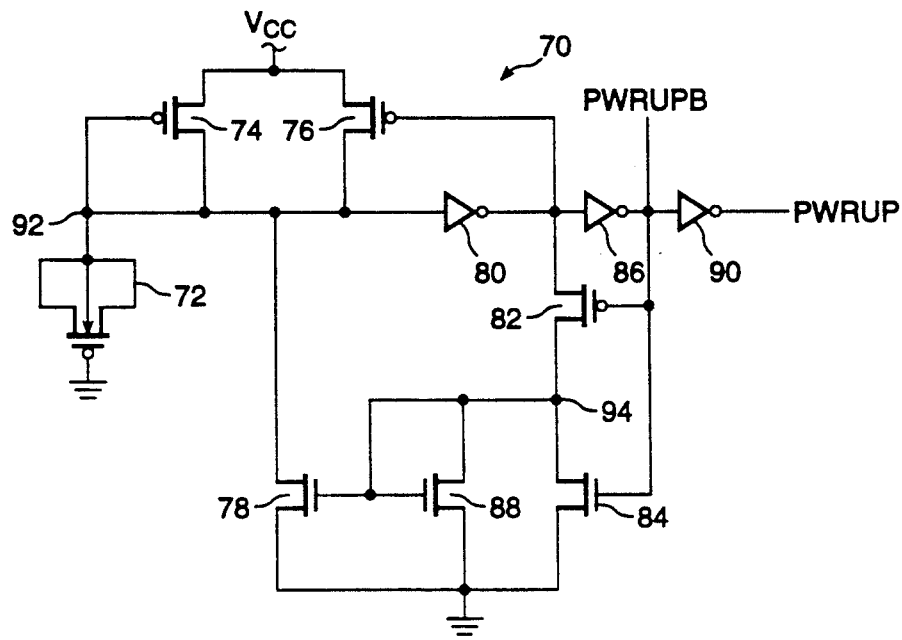
FIG. 4 is a schematic diagram of an illustrative circuit for generating the PWRUP and PWRUPB signals used in the circuitry of FIG. 2.

Referring now to FIG. 4, a schematic diagram of a circuit 70 for generating the PWRUP and PWRUPB signals is shown. A P-Channel MOS transistor 72, configured as a capacitor has its gate connected to ground and its other plate connected to the drain of a diode-connected P-Channel MOS transistor 74 whose source is connected to the $V_{CC}$ node. A P-Channel MOS transistor 76 is connected in parallel with P-Channel MOS transistor 74. An N-Channel MOS transistor 78 is connected between the drains of P-Channel MOS transistors 74 and 76 and ground. A first inverter 80 has its input connected to the drains of P-Channel MOS transistors 74 and 76. Its output is connected to the gate of P-Channel MOS transistor 76 and to the source of P-Channel MOS transistor 82. N-Channel MOS transistor 84 is connected between P-Channel MOS transistor 82 and ground. A second inverter 86 has its input connected to the source of P-Channel MOS transistor 82 and its output connected to the gate of P-Channel MOS transistor 82. N-Channel MOS transistor 88 is connected in parallel with N-Channel MOS transistor 84 and as a current mirror to N-Channel MOS transistor 84. A third inverter 90 has its input connected to output of inverter 86 and its output forms the PWRUP signal. The output of inverter 86 forms the PWRUPB signal.

Initially, all circuit nodes are at zero volts. $V_{CC}$ is assumed to ramp up at a rate of about 6 μs/volt. At power-up, between t=0 and t=5 μs, capacitor 72 maintains node 92, the common drain connection of P-Channel MOS transistors 74 and 76, low. P-Channel MOS transistor 74, therefore, is always on. Therefore, the output of first inverter 80 follows the rising $V_{CC}$. At about t=5 μs, the output of first inverter 80 is sufficiently charged to turn on the N-Channel MOS transistor in the second inverter 86, thus pulling down the PWRUPB signal node at the output of second inverter 86. The PWRUP signal node, at the output of third inverter 90, therefore follows $V_{CC}$.

From between about t=5 μs and t=18 μs, as the output of first inverter 80 rises with $V_{CC}$, and since the gates of P-Channel MOS transistor 82 and N-Channel MOS transistor 84, driven by second inverter 86, are low, N-Channel MOS transistor 84 is off, P-Channel MOS transistor 82 is on, and the node 94, comprising the common drain connection of P-Channel and N-Channel MOS transistors 82 and 84 is charged. The current mirror comprising N-Channel MOS transistors 78 and 88 turns on harder and pulls down node 92. The output of the first inverter 80 (a weak inverter connected to the gate of P-Channel MOS transistor 76) is pulled down by N-Channel MOS transistor 88 through P-Channel MOS transistor 82, and, while following $V_{CC}$, is less than $V_{CC}$. When $V_{CC}$ minus the voltage at the output of first inverter 80 equals a P threshold, P-Channel MOS transistor 76 turns on. Since it is a large device, it can "fight" N-Channel MOS transistor 78, which is weakly on, to charge up node 92. This occurs at $V_{CC}$=3 to 3.5 volts and causes several transitions at about t=18 μs. Node 92 goes from low to $V_{CC}$, the output of first inverter 80 goes from high to low, the PWRUPB node goes from low to high ($V_{CC}$), and the PWRUP node goes from high ($V_{CC}$) to low. This is the desired behavior of the circuit. The power-up period is from about t=5 μs to t=18 μs.

Figure 5:
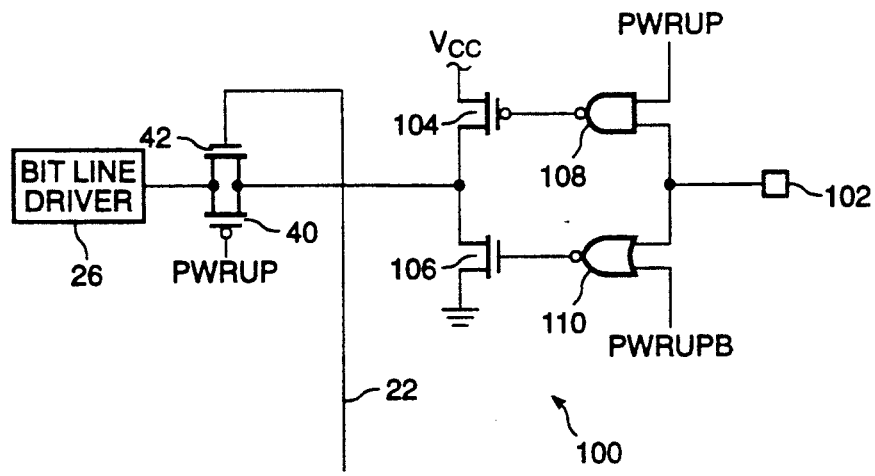
FIG. 5 is a schematic diagram of an illustrative circuit for providing a user selectable power-up state.

Referring now to FIG. 5, an embodiment of the present invention is disclosed in which the power-up state of the memory cells is user selectable. FIG. 5 reproduces a portion of the circuitry disclosed in FIG. 2. To allow an external signal value set by a user via an I/O pad on the integrated circuit containing the circuitry of the present invention to be the "known state" to which the RAM is initialized, the circuit of FIG. 2 may be modified by removing P-Channel MOS transistor 52, and connecting the gate of N-Channel pass gate transistor 42 to the bit line 22.

A circuit 100 connected to I/O pad 102 comprises P-Channel MOS transistor 104 in series with N-Channel MOS transistor 106 between $V_{CC}$, and ground. The gate of P-Channel MOS transistor 104 is driven by the output of 2-input NAND gate 108, having one of its inputs connected to the PWRUP signal and the other one of its inputs connected to I/O pad 102. The gate of N-Channel MOS transistor 106 is driven by the output of 2-input NOR gate 110, having one of its inputs connected to the PWRUPB signal and the other one of its inputs connected to I/O pad 102.

The circuit of FIG. 5 causes the bit line 22 to be charged to the value on I/O pad 102. P-Channel MOS transistor 104 and N-Channel MOS transistor 106 can only be on during power-up (i.e., PWRUP rising with $V_{CC}$, PWRUPB "off"). After power-up they have no effect because gates 108 and 110 keep them off. As PWRUP rises, NAND gate 108 goes high (turning off P-Channel MOS transistor 104) unless the voltage at I/O pad 102 is high, in which case the output of NAND gate 108 is low, P-Channel MOS transistor 104 is on, charging bit line 22 high. Similarly, N-Channel MOS transistor 106 only pulls bit line 22 low if the voltage at I/O pad 102 is low while PWRUPB signal is low.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an integrated circuit including a random access memory cell, said memory cell having an output node connectable to a bit line through a select device, said select device driven by a signal from a word line driver on a word line and said bit line driven by a bit line driver, apparatus for setting said memory cell to a known state during a power-up interval of said integrated circuit while a potential difference powering said integrated circuit increases from zero volts to an operating value, said apparatus comprising:
    first means for disconnecting said bit line driver from said bit line during said power-up interval;
    second means for disconnecting said word line driver from said bit line during said power-up interval;
    third means for writing a selected state into said memory cell during said power-up interval.

2. In an integrated circuit powered by a first potential difference to ground and including at least one random access memory cell powered by a source of a second potential difference to ground larger than said first potential difference, said at least one memory cell comprising a cross-coupled latch having an output node connectable to a bit line through a select device, said select device driven by a signal from a word line driver on a word line and said bit line driven by a bit line driver, apparatus for setting said at least one memory cell to a known state during a power-up interval of said integrated circuit while said second potential difference increases from zero volts to an operating value, said apparatus comprising:

first means for disconnecting said word line driver from said select device and for turning on said select device during said power-up interval; and second means for disconnecting said bit line driver from said bit line and for connecting said second potential difference to said bit line during said power-up interval.

3. In an integrated circuit including a random access memory cell, said memory cell having an output node connectable to a bit line through a select device, said select device driven by a signal from a word line driver on a word line and said bit line driven by a bit line driver, apparatus for setting said memory cell to a user-selectable state during a power-up interval of said integrated circuit while a potential difference powering said integrated circuit increases from zero volts to an operating value, said apparatus comprising:

first means for disconnecting said bit line driver from said bit line during said power-up interval;

second means for disconnecting said word line driver from said bit line during said power-up interval;

third means for writing said user-selectable state into said memory cell during said power-up interval.

4. In an integrated circuit powered by a first potential difference to ground and including at least one random access memory cell powered by a source of a second potential difference to ground larger than said first potential difference, said at least one memory cell comprising a cross-coupled latch having an output node connectable to a bit line through a select device, said select device driven by a signal from a word line driver on a word line and said bit line driven by a bit line driver, apparatus for setting said at least one memory cell to a user-selectable state during a power-up interval of said integrated circuit while said second potential difference increases from zero volts to an operating value, said apparatus comprising:

first means for disconnecting said word line driver from said select device and for turning on said select device during said power-up interval; and second means for disconnecting said bit line driver from said bit line and for connecting a signal representing said user-selectable state to said bit line during said power-up interval.

* * * * *